(12) United States Patent
Moribe et al.

(10) Patent No.: US 6,205,023 B1
(45) Date of Patent: Mar. 20, 2001

(54) COOLING ARRANGEMENT COMPRISING FOR A HEAT SOURCE A HEAT SINK MOVABLE ON AN EXTERNAL SINK

(75) Inventors: Makoto Moribe, Tokyo; Hironobu Goto, Miyagi; Kazuki Yoshida, Tokyo, all of (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/425,367

(22) Filed: Oct. 22, 1999

Related U.S. Application Data

(63) Continuation of application No. 08/976,066, filed on Nov. 21, 1997, now abandoned.

(30) Foreign Application Priority Data

Nov. 22, 1996 (JP) .................................................. 6-311808

(51) Int. Cl.⁷ ...................................................... M05K 7/20
(52) U.S. Cl. .................... 361/704; 361/715; 361/716; 361/719; 174/16.3; 165/80.2; 165/185
(58) Field of Search ..................................... 361/688, 690, 361/706, 707, 709–711, 715, 716, 719, 720, 752; 174/16.3; 165/80.2, 80.3, 185

(56) References Cited

U.S. PATENT DOCUMENTS

| 4,029,999 | 6/1977 | Neumann et al. . |
| 4,298,904 | * 11/1981 | Koenig ................................. 361/720 |
| 4,546,407 | 10/1985 | Benenati . |
| 4,825,337 | * 4/1989 | Karpman ............................. 361/716 |
| 5,424,913 | 6/1995 | Swindler . |
| 5,999,407 | * 12/1999 | Meschter et al. ..................... 361/704 |

FOREIGN PATENT DOCUMENTS

| 2-79094 | 6/1990 | (JP) . |
| 4-74489 | 6/1992 | (JP) . |
| 411233987 | 8/1999 | (JP) . |

* cited by examiner

Primary Examiner—Leo P. Picard
Assistant Examiner—Boris L. Chervinsky
(74) Attorney, Agent, or Firm—Scully, Scott, Murphy & Presser

(57) ABSTRACT

In an electronic unit which comprises a heat source, is supported in a casing, and should be kept below an allowable temperature, a movable heat sink is brought into thermal contact with the heat source and an external heat sink of the casing. Preferably, the movable heat sink is movable into and out of the thermal contact with the heat source and is slidably guided by a guide member of the casing. More preferably, a resilient thermal conductive member is interposed between the heat source and the movable heat sink.

14 Claims, 3 Drawing Sheets

COOLING ARRANGEMENT COMPRISING FOR A HEAT SOURCE A HEAT SINK MOVABLE ON AN EXTERNAL SINK

CROSS REFERENCE TO RELATED APPLICATIONS

This application is a continuation of application Ser. No. 08/976,066, filed Nov. 21, 1997, now abandoned.

BACKGROUND OF THE INVENTION

This invention relates to a cooling arrangement for an electronic device comprising a part which is susceptible to a temperature rise while the electronic device is put in operation.

In the manner which will later be described in greater detail, the electronic device is typically at least one integrated circuit which serves as a heat source element. Such at least one electronic unit is often encased in a casing as a packaging. The casing comprises surrounding walls in, for example, a rectangular prism to enclose a hollow space in which the electronic unit or units are removably situated. The casing is supported or otherwise placed in an atmosphere with one of the surrounding walls held as a bottom wall on a predetermined plane, such as a horizontal plane.

In a conventional cooling arrangement of this type, the electronic units are supported orthogonally by the bottom wall. In order to keep the heat source element or elements in a predetermined temperature range, heat must be conveyed from most part of the heat source element to the atmosphere through the hollow space and the casing. In addition, the casing must have a low thermal resistance.

In another conventional cooling arrangement, the heat source element is attached to a "plug-in" member for attachment and removal of the electronic unit to and from the casing. The casing comprises a pair of side walls. Each of the side walls comprises a guiding member for slidably receiving the plug-in member. Furthermore, a heat sink is attached to the plug-in member in thermal contact with the heat source element.

In this example, each electronic unit comprises the heat source element, the plug-in member, and the heat sink. The electronic unit therefore has a structure which is unavoidably subjected to various problems in order to allow the attachment and the removal and to effectively cool the heat source element.

In still another conventional cooling arrangement wherein the heat source element has a principal surface and is attached to the plug-in member, the heat sink is provided with an inside surface which is adopted to the principal surface thereby to reduce a thermal resistance between the heat sink and the heat source element. In this case, such heat sinks must be adapted individually to the heat source elements. In other words, it has been difficult to apply this structure to various heat source elements.

SUMMARY OF THE INVENTION

It is consequently an object of the present invention to provide a cooling arrangement for a plurality of electronic units encased in a casing, which cooling arrangement can effectively cool heat source elements of the electronic units.

It is another object of this invention to provide a cooling arrangement which is of the type described and which has a low thermal resistance between the heat source elements and an atmosphere surrounding the casing.

It is still another object of this invention to provide a cooling arrangement which is of the type described and in which the casing can be made of an optional material.

It is yet another object of this invention to provide a cooling arrangement which is of the type described and which has a structure common to various heat source elements.

It is a further object of this invention to provide a cooling arrangement which is of the type described and which is simple in structure and light-weighted.

It is a still a further object of this invention to provide a cooling arrangement which is of the type described and in which the casing comprises an external heat sink having an outside surface in contact with the surrounding atmosphere and an inside surface in contact with a hollow space enclosed with the casing.

Other objects of this invention will become clear as the description proceeds.

In accordance with this invention, there is provided a cooling arrangement for an electronic unit used in a hollow space of a casing comprising an external heat sink having an inside surface in contact with the hollow space, the electronic unit comprising a heat source element having a principal surface, a plug-in member supported on the casing, and a movable heat sink movable relative to the casing in thermal contact with the principal and the inside surface.

DESCRIPTION OF THE PREFERRED EMBODIMENTS

Figure 1:
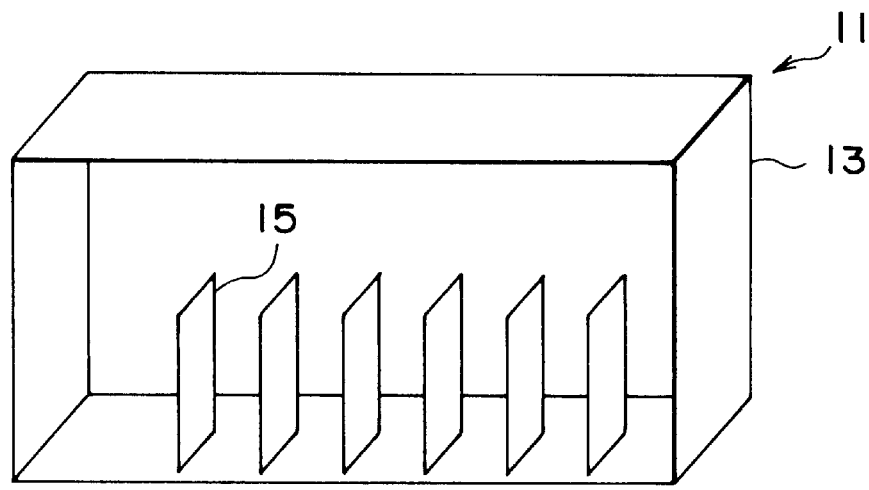
FIG. 1 schematically shows a perspective view of a conventional cooling arrangement with a front wall of a casing removed to illustrate a plurality of electronic devices placed in the casing.
Figure 2:
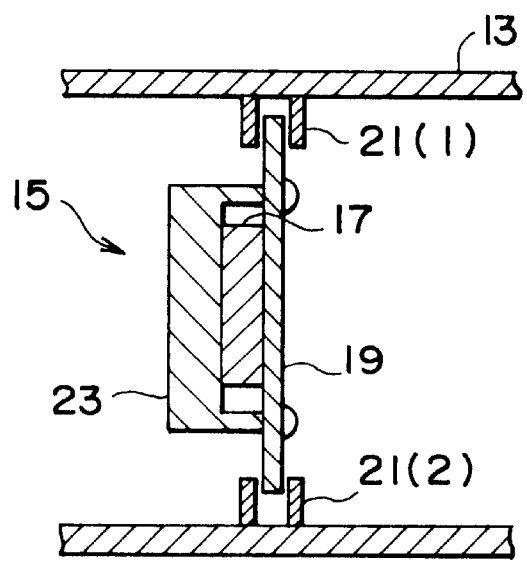
FIG. 2 shows a schematic horizontal section of another conventional cooling arrangement.
Figure 3:
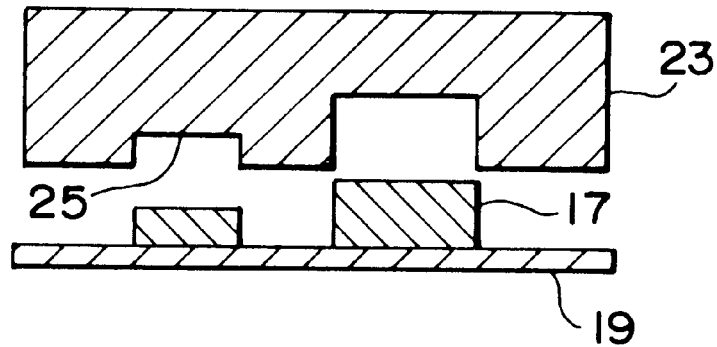
FIG. 3 shows a schematic vertical section of an electronic unit used in still another conventional cooling arrangement.

Referring to FIGS. 1 through 3, conventional cooling arrangements for an electronic device will first be described in order to facilitate an understanding of the present invention. It should be noted throughout the drawing figures that similar parts are designated by like reference numerals and are similarly operable.

In FIG. 1, a cooling arrangement is in general for an electronic device 11 comprising a casing 13 of a heat conductive material. Typically, the casing 13 is composed of six surrounding walls in a rectangular prism surrounding a hollow space and is in a surrounding atmosphere. In the manner depicted with a front wall of the casing removed, the electronic device comprises a plurality of electronic units which will hereafter be indicated either singly or individually by a reference numeral 15. Each electronic unit 15 comprises a heat source element 17 which will presently be illustrated and is susceptible to a temperature rise while the electronic device 11 is put in operation. In the example being illustrated, the electronic units 15 are vertically supported on a bottom wall of the casing 13 as packagings, respectively.

In order to keep the electronic units 15 in a predetermined temperature range in the manner described heretobefore, heat must be conveyed in such a conventional cooling arrangement from the heat source elements 17 to the surrounding atmosphere through the hollow space and the casing 13. The efficiency of heat conveyance or of cooling therefore depends on a thermal resistance of the casing 13 in particular. As a consequence, the casing 13 must have a low thermal resistance. It has been unavoidable in addition that the heat conveyance between the heat source elements 17 and the surrounding atmosphere is adversely affected by the hollow space intervening in a path of the heat conveyance or cooling.

In FIG. 2, another conventional cooling arrangement comprises the heat source element 17 which may be an integrated circuit and is attached to a "plug-in" member 19 of the electronic unit 15. The casing 13 comprises a front and a back wall which are depicted in horizontal section and which comprise a pair of guide members 21(1) and 21(2) on their surfaces inwardly directed in contact with the hollow space. The plug-in member 19 is removably vertically supported by the guide members 21 (the suffixes (1) and (2) are omitted).

As a part of the electronic unit 15, a heat sink 23 is attached to the plug-in member 19 in thermal contact with the heat source element 17. It should be noted here that the heat sink 23 must allow plug-in or attachment and removal of the plug-in member 19 to and from the guide members 21. Heat renerated by the heat source element 17 is absorbed by the heat sink 23. In the example being illustrated, the plug-in member 19 and the guide members 21 are depicted as metal members merely for convenience of illustration. The electronic unit 15 must satisfy various requirements of enabling simultaneous attachment or removal of the heat sink 23 and a combination of the heat source element 17 and the plug-in member 19.

In FIG. 3, only a part of still another conventional cooling arrangement is illustrated with the plug-in member 19 depicted horizontally rather than vertically. The heat source element 17 is depicted to comprise two separate parts. In this manner, the heat source element 17 has a principal surface which is directed topwise in the figure. The heat sink 23 has an inside surface 25 which is adapted to the principal surface. This would reduce a thermal resistance between the heat source element 17 and the heat sink 23. The heat sink 23 must, however, be individually manufactured in consideration of a shape of the principal surface.

Figure 4:
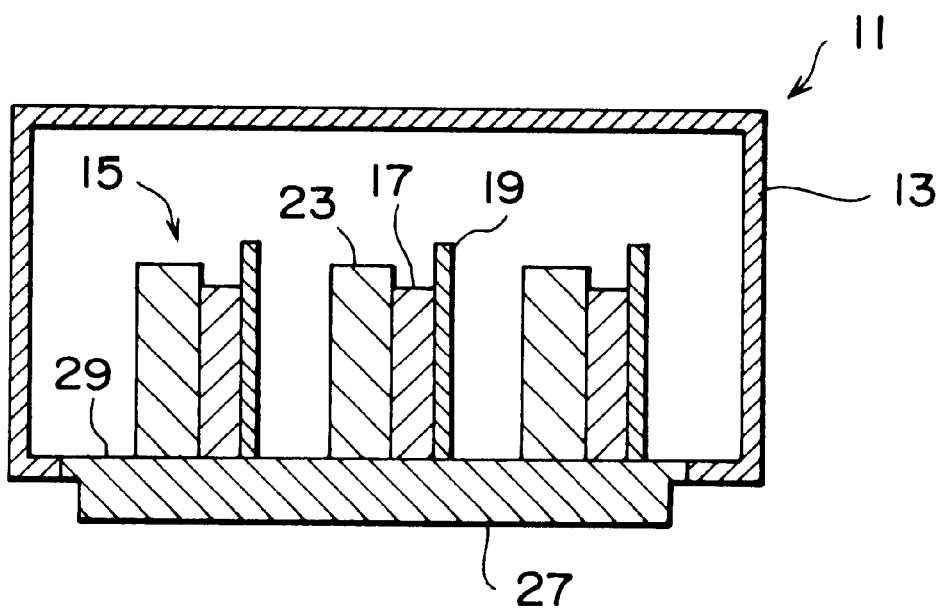
FIG. 4 schematically shows a vertical section of a cooling arrangement according to an embodiment of the instant invention.

Referring now to FIG. 4, the description will proceed to a cooling arrangement according to a first preferred embodiment of this invention. In the manner described in the foregoing, the cooling arrangement is for preventing a temperature range of operation of an electronic device 11 from rising beyond a predetermined temperature. The electronic device 11 is typically a telecommunication device and comprises a casing 13 enclosing a hollow space in which encased is at least one electronic unit 15 including a heat source element 17. In the example being illustrated, the casing 13 has a form of a rectangular prism defined by six surrounding walls, which may now be made of any material as will become shortly clear although the surrounding walls are depicted merely for convenience of illustration as made of metal. Like in FIG. 2, the heat source element 17 is attached to a plug-in member 19 and accompanied by a heat sink which will now be referred to as a movable heat sink 23 and is in thermal contact with the heat source element 17 at its principal surface where its temperature would rise in principle.

It should henceforth be noted that the casing 13 comprises as a main part of one of the surrounding walls an external heat sink 27 made of a high temperature or heat conductive material, typically metal, and having an inside surface 29 in contact with the hollow space and an outside surface exposed to an ambient atmosphere. In the illustrated example, each electronic unit 15 is removably supported orthogonal to the external heat sink 27 as by plugging the plug-in member 19 in the external heat sink 27 and with a bottom end of the movable heat sink 23 in thermal contact with the inside surface 29. The movable heat sink 23 is movable relative to the casing 13 and need not be made of metal provided thit this heat s ink 23 is made of a material having a high heat or temperature conductivity like the external heat sink 27. It is now understood that the heat is conveyed from the heat source element 17 to the ambient atmosphere through the movable and the external heat sinks 23 and 27 to cool down the heat source element 17 and that the material of the casing 13 has no concern in this heat conveyance except for the external heat sink 27.

Referring afresh to FIGS. 5 and 6 and again to FIG. 4, a cooling arrangement comprises the casing 13 having a front and a back wall which are accompanied according to a second embodiment of this invention by first and second guide members 21(1), 21(2) and 22(1), 22(2), respectively. The first guide members 21 guide the plug-in member 19 along the direction indicated by Arrow A similar to those described with regard to FIG. 2. Each second guide member 22 is provided with a pair of long elliptic through holes 31(1) and 31(2) or 31 which are not parallel to a vertical direction and will presently be described more correctly.

Figure 5:
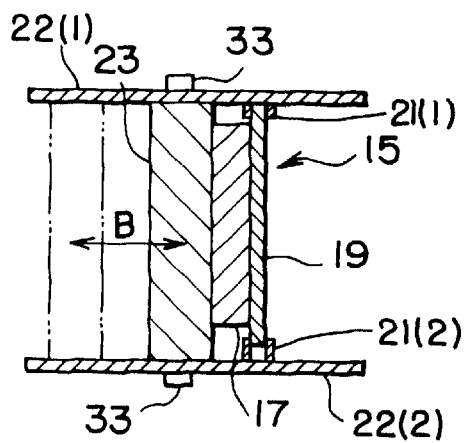
FIG. 5 is a schematic horizontal sectional view of a cooling arrangement according to a second embodiment of this invention.
Figure 6:
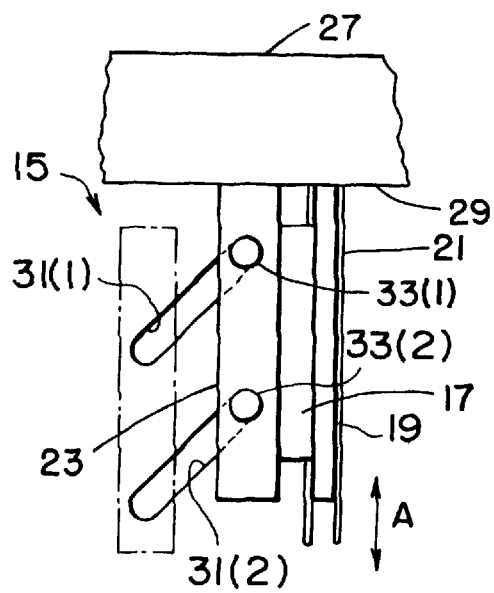
FIG. 6 is a schematic top view of the cooling arrangement illustrated in FIG. 5.

In each electronic unit 15, the movable heat sink 23 is movable, relative to the plug-in member 19 independently of plugging of the plug-in member 19 for attachment and removal of the electronic unit 15 to and from the external heat sink 27. On each side surface of the movable heat sink 23, a pair of pins 33(1) and 33(2) or 33 are fixed so as to be slidable in the through holes 31 in the direction of Arrow B when the plug-in member 19 is plugged into and from the external heat sink 27 in a direction indicated in FIG. 6 by Arrow A. When duly placed, the electronic unit 15 becomes as shown in FIGS. 5 and 6 by solid lines. During plugging in and out, the movable heat sink 23 gets off from the thermal contact with the inside surface 29 of the external heat sink 27 to move as indicated in FIG. 5 by Arrow B to a position indicated in each of FIGS. 5 and 6 by a dash and two-dot lines. It is now understood more correctly that the through holes 31 show loci of movement of the pins 33 and that the through holes 31 should be open at their top ends to snugly receive and slidably guide the pins 33 on putting the electronic unit 15 into position.

It is possible in FIGS. 5 and 6 to select the movable heat sink 23 having the inside surface 25 (FIG. 3) in conformity with the principal surface of the heat source element to insure the thermal contact. Such a selected heat sink 23 does not adversely affect the attachment and the removal of the electronic unit 15 to and from the casing 13.

Figure 7:
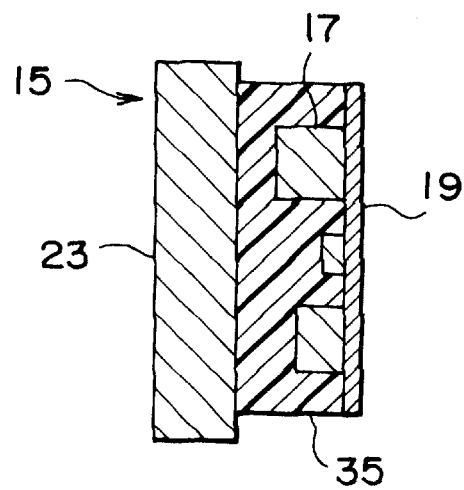
FIG. 7 schematically shows a vertical section of an electronic unit used in a cooling arrangement according to a third embodiment of this invention.

Turning to FIG. 7, attention will be directed to a cooling arrangement according to a third preferred embodiment of this invention. It should be understood in FIG. 7 that the electronic unit 15 alone is illustrated. In other respects, this cooling arrangement is identical with either of the cooling arrangements illustrated with reference only to FIG. 4 and to FIGS. 4 through 6.

In FIG. 7, the electronic unit 15 comprises, besides the heat source element 17 having the principal surface, the plug-in member 19, and the movable heat sink 23 between the heat source element 17 and the movable heat sink 23, a resilient or pliable thermal or temperature conductive member 35 made of a resilient thermal or temperature conductive material, such as a silicone rubber, although depicted as though this member 35 is made of a synthetic resin or plastic material. It is possible to preliminarily apply this member 35 either to the heat source element 17 or to the movable heat sink 23. It is readily understood that this member 35 insures the thermal contact between the heat source element 17 and the movable heat sink 23 even when the heat source element 17 is composed of three parts as depicted and/or has the principal surface of a complicated shape.

While this invention has thus far been described in specific conjunction with a few preferred embodiments thereof, it will now be readily possible for one skilled in the art to carry this invention into effect in various other manners. For example, the electronic unit 15 may be only one in number. The casing 13 may comprise the external heat sink 27 apart from its bottom wall and need not enclose the hollow space entirely. The casing 13 may consist only of the external heat sink 27, in which case the "hollow" space is a part of the ambient atmosphere adjacent to the electronic unit or units 15. The "inside" surface, as herein called, is a surface on which the electronic unit 15, above all the movable heat sink 23, is brought into contact. The pins 33 of the movable heat sink 23 may be only one on each side surface.

What is claimed is:

1. A cooling arrangement comprising;
   a casing having a hollow space and a pair of guide members connected thereto;
   an external heat sink having an inside surface in communication with the hollow space; and
   an electronic unit comprising:
      a heat source element having a principal surface;
      a plug-in member supported on the casing; and
      a movable heat sink movably supported on the guide members between a first position in which the movable heat sink does not contact the heat source element and a second position in which a first surface of the movable heat sink is in thermal contact with the principal surface of the heat source element and in which a second surface of the movable heat sink is in thermal contact with the inside surface of the external heat sink.

2. The cooling arrangement as claimed in claim 1, wherein the movable heat sink has a pair of third surfaces, each third surface having at least one pin fixed thereto, each guide member has a groove corresponding to the at least one pin for guiding the pins and the movable heat sink attached thereto into thermal contact with the principal and inside surfaces.

3. The cooling arrangement as claimed in claim 1, further comprising a resilient thermal conductive member between the heat source element at the principal surface and the movable heat sink.

4. The cooling arrangement as claimed in claim 3, wherein the resilient thermal conductive member is preliminarily attached to the movable heat sink to be brought into the thermal contact with the principal surface.

5. The cooling arrangement as claimed in claim 3, wherein the resilient thermal conductive member is preliminarily attached to the principal surface of said heat source element to be brought into the thermal contact with the first surface of the movable heat sink.

6. The cooling arrangement as claimed in claim 1, wherein the plug-in member plugs into the casing to be supported thereon in a first direction and the movable heat sink moves between the first and second positions in a second direction.

7. The cooling arrangement as claimed in claim 6, wherein the first and second directions are different.

8. A cooling arrangement comprising:
   a casing having a hollow space;
   an external heat sink having an inside surface in communication with the hollow space; and
   an electronic unit comprising:
      a heat source element having a principal surface;
      a plug-in member supported on the casing, the plug-in member being plugged into the casing in a first direction; and
      a movable heat sink movable independent of the plug-in member in a second direction between a first position in which the movable heat sink does not contact the heat source element and a second position in which a first surface of the movable heat sink is in thermal contact with the principal surface of the heat source element and in which a second surface of the movable heat sink is in thermal contact with the inside surface of the external heat sink.

9. The cooling arrangement as claimed in claim 8, wherein the first and second directions are different.

10. The cooling arrangement as claimed in claim 9, wherein the casing further comprises a pair of guide members for guiding the movable heat sink in the second direction between the first and second positions.

11. The cooling arrangement as claimed in claim 10, wherein the movable heat sink has a pair of third surfaces, each third surface having at least one pin fixed thereto, each guide member has a groove corresponding to the at least one pin for guiding the pins and the movable heat sink attached thereto in the second direction into thermal contact with the principal and inside surfaces.

12. The cooling arrangement as claimed in claim 8, further comprising a resilient thermal conductive member between the heat source element at the principal surface and the movable heat sink.

13. The cooling arrangement as claimed in claim 12, wherein the resilient thermal conductive member is preliminarily attached to the movable heat sink to be brought into the thermal contact with the principal surface.

14. The cooling arrangement as claimed in claim 12, wherein the resilient thermal conductive member is preliminarily attached to the principal surface of said heat source element to be brought into the thermal contact with the first surface of the movable heat sink.

* * * * *

UNITED STATES PATENT AND TRADEMARK OFFICE
CERTIFICATE OF CORRECTION

| | |
|---|---|
| PATENT NO. : 6,205,023 B1 | |
| DATED : March 20, 2001 | |
| INVENTOR(S) : M. Moribe et al. | |

It is certified that error appears in the above-identified patent and that said Letters Patent is hereby corrected as shown below:

Title page,
Item [30] Foreign Application Priority Data: "3-311808" should read -- 8-311808 --

Column 3,
Line 33, "renerated" should read -- generated --

Signed and Sealed this

Eleventh Day of December, 2001

Attest:

NICHOLAS P. GODICI
Attesting Officer
Acting Director of the United States Patent and Trademark Office

UNITED STATES PATENT AND TRADEMARK OFFICE
CERTIFICATE OF CORRECTION

PATENT NO.   : 6,205,023 B1  
DATED        : March 20, 2001  
INVENTOR(S)  : M. Moribe et al.

It is certified that error appears in the above-identified patent and that said Letters Patent is hereby corrected as shown below:

Title page,  
Item [30], Foreign Application Priority Data: "3-311808" should read -- 8-311808 --

Column 3,  
Line 33, "renerated" should read -- generated --

Signed and Sealed this

Eighteenth Day of December, 2001

Attest:

*Attesting Officer*

JAMES E. ROGAN  
*Director of the United States Patent and Trademark Office*